US006380738B1

(12) United States Patent
Zhou

(10) Patent No.: US 6,380,738 B1
(45) Date of Patent: Apr. 30, 2002

(54) METHOD AND APPARATUS FOR REDUCING IMAGE ARTIFACTS CAUSED BY MAGNET VIBRATION IN AN MR IMAGING SYSTEM

(75) Inventor: Xiaohong Zhou, Houston, TX (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/469,864

(22) Filed: Dec. 22, 1999

Related U.S. Application Data
(60) Provisional application No. 60/165,523, filed on Nov. 15, 1999.

(51) Int. Cl.[7] .................................................. G01V 3/00
(52) U.S. Cl. ........................ 324/309; 324/307; 324/306
(58) Field of Search ................................ 324/390, 307, 324/306, 314, 300

(56) References Cited

U.S. PATENT DOCUMENTS

| | | | |
|---|---|---|---|
| 4,698,591 A | 10/1987 | Glover et al. | ............... 324/307 |
| 5,151,656 A | 9/1992 | Maier et al. | ............... 324/309 |
| 5,864,233 A | 1/1999 | Zhou et al. | .................. 324/309 |
| 5,869,965 A | 2/1999 | Du et al. | .................... 324/309 |
| 5,923,168 A | 7/1999 | Zhou et al. | .................. 324/309 |

OTHER PUBLICATIONS

Zhou et al., High–Field MR Microscopy Using Fast Spin–Echoes, Magnetic Resonance in Medicine 30, pp. 60–67 (1993).

Jackson et al, Selection Of A Convolution Function For Fourier Inversion Using Gridding, IEEE Transactions On Medical Imaging, vol. 10, No. 3, pp. 473–478 (Sep. 1991).

*Primary Examiner*—Jay Patidar
*Assistant Examiner*—Brij B. Shrivastav
(74) *Attorney, Agent, or Firm*—Foley & Lardner; Peter J. Vogel; Michael A. Della Penna

(57) ABSTRACT

A magnetic resonance (MR) imaging system including a method and apparatus for reducing image artifacts caused by magnet vibration is disclosed herein. The system includes a magnetic field vibration quantification and compensation scheme including quantifying a vibration error component included in the magnetic field configured to acquire k-space data corresponding to an MR image, and correcting the k-space data using the vibration error component. The vibration-induced magnetic field perturbation includes a spatially invariant magnetic field, a spatially linear readout magnetic field gradient, a spatially linear phase-encoding magnetic field gradient, and a spatially linear slice-selection magnetic field gradient. The vibration error component can be at least one of a spatially independent phase error of the spatially invariant magnetic field, a $k_x$-space displacement error of the spatially linear readout magnetic field gradient, a $k_y$-space displacement error of the spatially linear phase-encoding magnetic field gradient, and a slice-selection error of the spatially linear slice-selection magnetic field gradient.

30 Claims, 6 Drawing Sheets

METHOD AND APPARATUS FOR REDUCING IMAGE ARTIFACTS CAUSED BY MAGNET VIBRATION IN AN MR IMAGING SYSTEM

CROSS-REFERENCE TO RELATED APPLICATIONS

This application claims priority from U.S. provisional application Ser. No. 60/165,523 by Zhou, entitled "Method and Apparatus for Reducing Image Artifacts caused by Magnet Vibration in a MR Imaging System" filed Nov. 15, 1999.

BACKGROUND OF THE INVENTION

The present invention relates generally to magnetic resonance (MR) imaging systems. More particularly, the present invention relates to an MR imaging system equipped to reduce image artifacts caused by magnet vibrations produced therein.

When an object of interest, such as human tissue, is subjected to a uniform magnetic field (polarizing field $B_0$, along the z direction in a Cartesian coordinate system denoted as x, y, and z), the individual magnetic moments of the spins in the tissue attempt to align with this polarizing field, but precess about it at their characteristic Larmor frequency. If the object, or tissue, is subjected to a magnetic field (excitation field $B_1$) which is in the x-y plane and which is near the Larmor frequency, the net aligned moment, $M_z$, may be rotated or "tipped" at a certain tipping angle, into the x-y plane to produce a net traverse magnetic moment $M_t$. A signal is emitted by the excited spins after the excitation field $B_1$ is terminated, and this signal may be received and processed to form an MR image.

When utilizing these signals to produce MR images, linear magnetic field gradients ($G_x$, $G_y$, and $G_z$) are also employed. Typically, the object to be imaged is scanned by a sequence of measurement cycles in which these gradient waveforms vary according to the particular localization method being used. The resulting set of received nuclear magnetic resonance (NMR) signals, also referred to as MR signals, are digitized and processed to reconstruct the image using one of many well-known reconstruction algorithms.

Ideally, a uniform magnetic field ($B_0$) and perfectly linear magnetic field gradients ($G_x$, $G_y$, and $G_z$) would be utilized to image the object of interest. In reality, however, perturbation to the magnetic field, such as eddy currents, gradient amplifier infidelity, gradient non-linearity, magnetic field inhomogeneity, and Maxwell terms, can exist, resulting in image artifacts such as blurring, distortion, ghosting, and shift in the reconstructed MR image. In recent years, as magnets included in MR imaging systems have become smaller in size and weight in order to reduce cost, another perturbation factor is emerging as an important source of image artifacts.

As magnet size and weight are reduced, magnet vibration is becoming an increasingly serious problem. Magnet vibration causes perturbation magnetic fields, i.e., magnetic fields with vibration components, to be applied to the object of interest. In turn, these vibration components produce undesirable image artifacts in the reconstructed MR image. Constrained by cost, it is often difficult to proactively design magnets to completely eliminate all critical vibration components.

Thus, there is a need for an MR imaging system capable of correcting or compensating for image artifacts caused by magnet vibration before reconstructing an MR image. In order to do so, there is a need for an MR imaging system capable of quantifying the magnetic field vibration components.

BRIEF SUMMARY OF THE INVENTION

One embodiment of the invention relates to a method for reducing image artifacts caused by magnet vibration in an MR imaging system. The method includes quantifying a vibration error component included in a perturbation magnetic field. The perturbation magnetic field is compensated to acquire k-space data corresponding to an MR image.

Another embodiment of the invention relates to an MR imaging system for reducing image artifacts caused by magnet vibration. The system includes a system control. The system control is capable of configuring a compensating magnetic field to offset a perturbation magnetic field produced by magnet vibration. The system control is further capable of calculating a vibration error component included in the perturbation magnetic field.

Still another embodiment of the invention relates to an MR imaging system for reducing image artifacts caused by magnet vibration. The system includes means for configuring a pulse sequence to acquire k-space data corresponding to an MR image. The pulse sequence includes compensating magnetic fields. The system further includes means for calculating a vibration error component included in the pulse sequence. The means for configuring is coupled to the means for calculating.

BRIEF DESCRIPTION OF THE DRAWINGS

The preferred embodiment will become more fully understood from the following detailed description, taken in conjunction with the accompanying drawings, wherein like reference numerals denote like elements, in which.

DETAILED DESCRIPTION OF THE INVENTION

Figure 1:
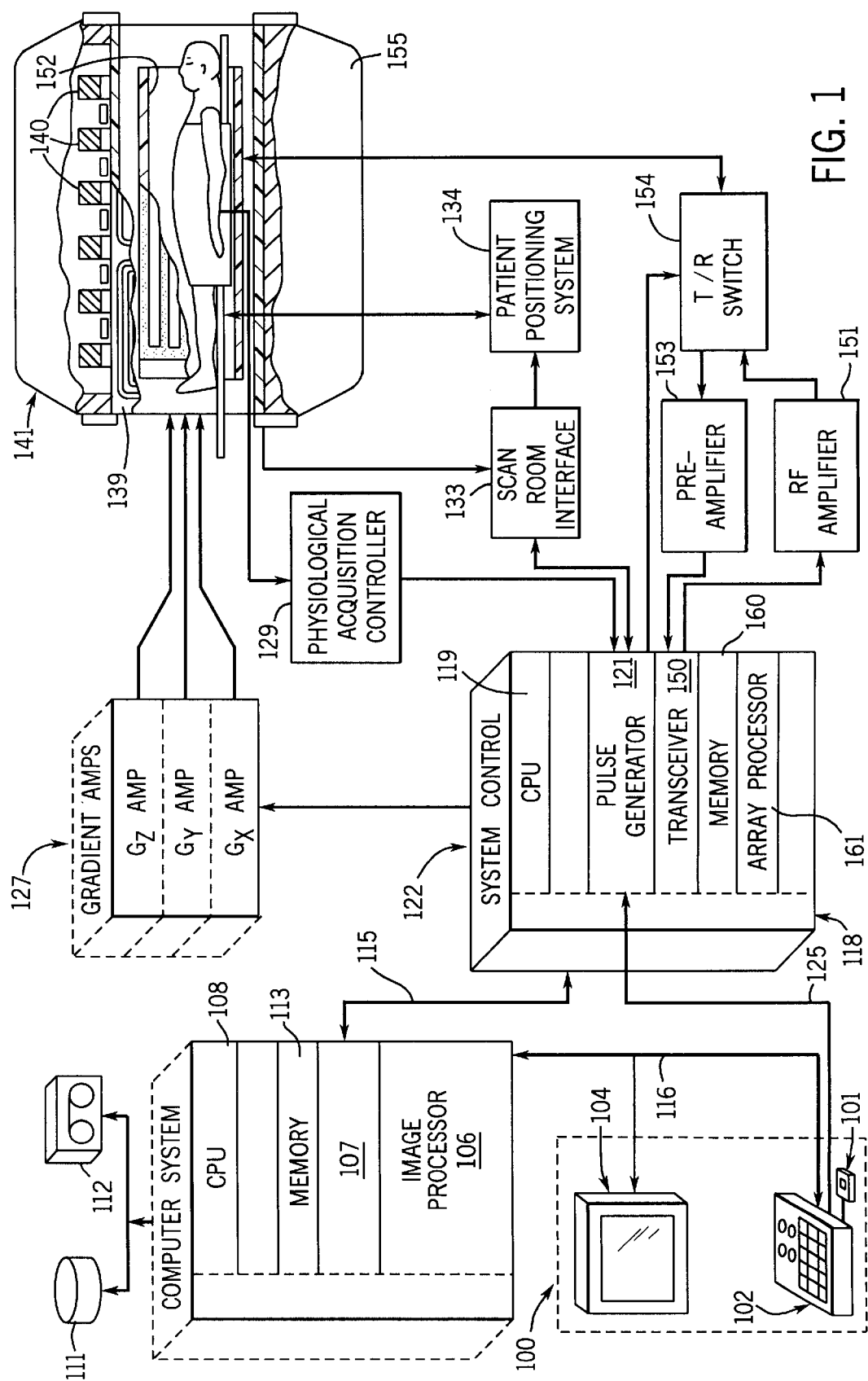
FIG. 1 is a block diagram of a magnetic resonance (MR) imaging system which employs an embodiment of the present invention.

Referring to FIG. 1, there is shown the major components of a magnetic resonance (MR) imaging system. The operation of the system is controlled from an operator console 100 which includes an input device 101, a control panel 102, and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicate the timing, strength and shape of RF pulses, and the timing of and length of a data acquisition window. The pulse generator module 121 connects to a set of gradient amplifiers 127, to control the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for spatially encoding acquired signals. The gradient coil assembly 139 forms part of a magnet assembly 141 which includes a polarizing magnet 140 and a wholebody RF coil 152.

A transceiver module 150 in the system control 122 produces pulses which are amplified by an RF amplifier 151 and coupled to the RF coil 152 by a transmit/receiver switch 154. The resulting signals emitted by the excited nuclei in the patient may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. The image data are conveyed through the serial link 115 to the computer system 107 where they are stored in the disk memory 111. In response to commands received from the operator console 100, these image data may be archived on the tape drive 112, or they may be further processed by the image processor 106 and conveyed to the operator console 100 and presented on the display 104.

Figure 2:
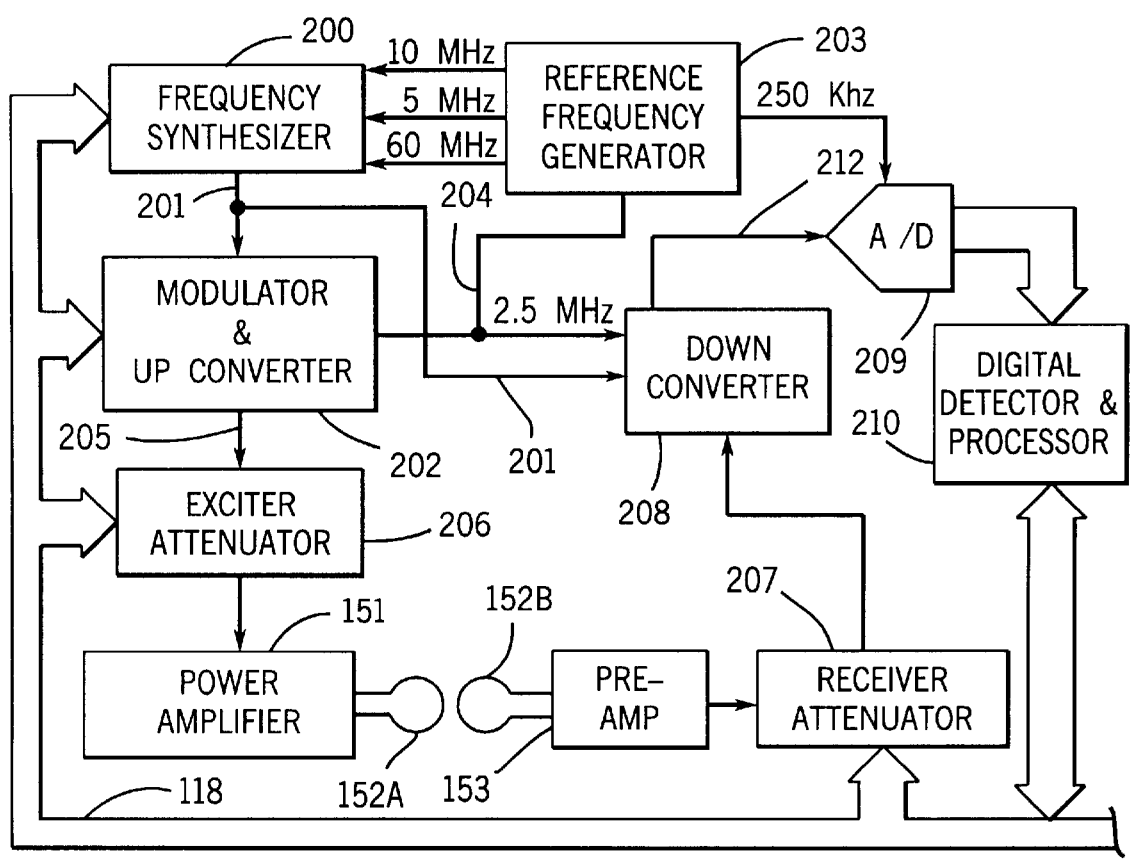
FIG. 2 is an electrical block diagram of a transceiver block which forms part of the MR imaging system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2, the MR signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the MR signal with the carrier signal on line 201 and then mixes the resulting difference signal with the 2.5 MHz reference signal on line 204. The down converted MR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

Mechanical vibration produced by magnet assembly 141 in the course of an MR image acquisition causes a non-ideal magnetic field to perturb an image data set corresponding to an object of interest. This non-ideal magnetic field, or a vibrating magnetic field b(t), causes the image data set to be non-ideal such that the reconstructed MR image can have various image quality problems such as distortion, ghosting, image shift, shading, blurring, and intensity variation. Hence, by identifying and quantifying one or more magnetic field vibration error components and compensating for these error components, image artifacts which would otherwise appear in the reconstructed MR image can be minimized or eliminated.

Vibrating magnetic field b(t), irrespective of its vibrational modes, must satisfy the Laplace equation $\nabla^2 b(t)=0$.

Thus, vibrating magnetic field b(t) can be described by the summation of its various spatial components (or spherical harmonics):

$$b(t) = b_o(t) + g_x(t)x + g_y(t)y + g_z(t)z + \ldots \quad (1)$$

where $b_o(t)$ is a spatially invariant magnetic field; $g_x(t)$, $g_y(t)$, and $g_z(t)$ are spatially linear gradient magnetic fields in the x, y, and z directions, respectively; and the omitted terms are spatially higher order magnetic fields. Notice that all the terms in Equation (1) depend on a time variable t. Typically, $b_o(t)$ is also referred to as a main magnetic field perturbation, $g_x(t)$ as a frequency-encoding or readout gradient perturbation, $g_y(t)$ as a phase-encoding gradient perturbation, and $g_z(t)$ as a slice-selection gradient perturbation.

It shall be assumed that the higher order gradient terms contain negligible vibration error components so that vibrating magnetic field b(t) can be approximated by the four terms explicitly shown in Equation (1). It should be understood, however, that a quantification and compensation scheme, to be described in greater detail hereinafter, may be implemented for the vibrating magnetic field b(t) including spatially higher order magnetic field terms.

Each of the four terms in Equation (1) may include multiple vibrational components, each component being defined by four parameters—an amplitude, a frequency, a phase, and a damping time constant. Accordingly, $b_o(t)$ can be expressed as:

$$b_0(t) = \sum_{m=1}^{M_0} a_m e^{-t/\lambda_m} \sin(2\pi f_m t + \zeta_m) \quad (2a)$$

where $M_o$ is the total number of vibrational modes, $a_m$ is an amplitude, $f_m$, is a frequency, $\zeta_m$ is a phase, $\lambda_m$ is a damping time constant, and m is an index of the vibrational mode. Similarly, the three linear gradient terms ($g_x(t)$, $g_y(t)$, and $g_z(t)$) in Equation (1) can be expressed as:

$$g_x(t) = \sum_{m=1}^{M_x} g_{x,m} e^{-t/\lambda_{x,m}} \sin(2\pi f_{x,m} t + \zeta_{x,m}) \quad (2b)$$

$$g_y(t) = \sum_{m=1}^{M_y} g_{y,m} e^{-t/\lambda_{y,m}} \sin(2\pi f_{y,m} t + \zeta_{y,m}) \quad (2c)$$

$$g_z(t) = \sum_{m=1}^{M_z} g_{z,m} e^{-t/\lambda_{z,m}} \sin(2\pi f_{z,m} t + \zeta_{z,m}) \quad (2d)$$

where $M_x$, $M_y$, and $M_z$ are the total number of vibrational modes; $g_{x,m}$, $g_{y,m}$, and $g_{z,m}$ are the amplitudes; $f_{x,m}$, $f_{y,m}$, and $f_{z,m}$ are the frequencies; $\zeta_{x,m}$, $\zeta_{y,m}$, and $\zeta_{z,m}$ are the phases; and $\lambda_{x,m}$, $\lambda_{y,m}$, and $\lambda_{z,m}$ are the damping time constants for $g_x(t)$, $g_y(t)$, and $g_z(t)$, respectively.

If we assume that the damping effect is negligible during data acquisition, Equations (2a)–(2d) can be simplified to:

$$b_0(t) = \sum_{m=1}^{M_0} a_m \sin(2\pi f_m t + \zeta_m) \quad (3a)$$

$$g_x(t) = \sum_{m=1}^{M_x} g_{x,m} \sin(2\pi f_{x,m} t + \zeta_{x,m}) \quad (3b)$$

$$g_y(t) = \sum_{m=1}^{M_y} g_{y,m} \sin(2\pi f_{y,m} t + \zeta_{y,m}) \quad (3c)$$

$$g_z(t) = \sum_{m=1}^{M_z} g_{z,m} \sin(2\pi f_{z,m} t + \zeta_{z,m}) \quad (3d)$$

The above simplification is being introduced to ease the description of the present invention. It should be understood that the present invention may be implemented using Equations (2a)–(2d), i.e., with non-negligible damping effect, instead of Equations (3a)–(3d).

To image the object of interest or a portion thereof, one or more pulse sequences (i.e., RF pulses and gradient pulses) is configured to induce and acquire a p×q array of raw k-space data points, comprising p columns of $k_x$-space data and q rows of $k_y$-space data. The pulse sequence causes one or more MR signals to be emitted from the excited object of interest and acquires the MR signal. Each MR signal provides one row of $k_y$-space data having p data points. In this manner, sampling a total of q MR signals will result in acquiring the p×q array of raw k-space data points, sufficient to perform image reconstruction of the object of interest.

Figure 3:
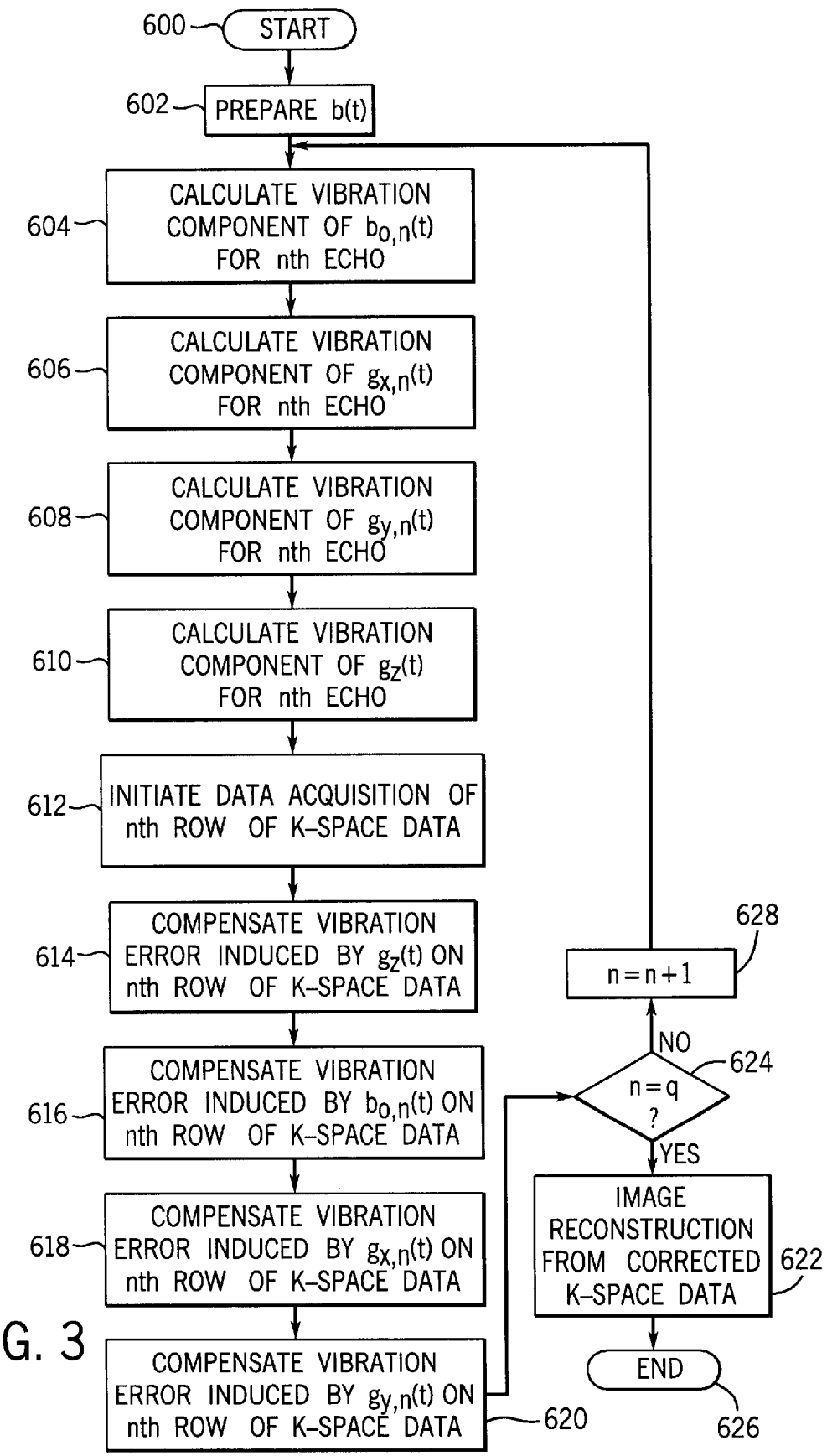
FIG. 3 is a flowchart of a magnetic field vibration quantification and compensation scheme implemented in the MR imaging system of FIG. 1.

Referring to FIG. 3, there is shown a flowchart of the magnetic field vibration quantification and compensation scheme. The scheme includes a start loop step 600, a prepare magnetic field b(t) step 602, a calculate vibration component of $b_{o,n}(t)$ step 604, a calculate vibration component of $g_{x,n}(t)$ step 606, a calculate vibration component of $g_{y,n}(t)$ step 608, a calculate vibration component of $g_z(t)$ step 610, an initiate image data acquisition step 612, a compensate error induced by $g_z(t)$ vibration component step 614, a compensate error induced by $b_{o,n}(t)$ vibration component step 616, a compensate error induced by $g_{x,n}(t)$ vibration component step 618, a compensate error induced by $g_{y,n}(t)$ vibration component step 620, an image reconstruction step 622, a decision step 624, an end loop step 626, and an incrementor step 628. This scheme is performed n=1, 2, . . . , q times such that all vibration error components corresponding to the vibrating magnetic field b(t) for each MR echo signal, or in another words, each row of k-space data, can be identified, quantified, and utilized to perform the error compensation on the corresponding k-space data. The vibration error components calculated in steps 604–610 are utilized by the system control 122 and/or the computer system 107 to perform the compensate steps 614–620. Since the actual equations involved in the quantification and compensation scheme will vary slightly depending on the type of pulse sequence implemented to acquire the MR image, the scheme will be illustrated using three different pulse sequences: a spin-echo (SE) pulse sequence, a fast gradient echo (FGRE) pulse sequence, and a fast spin echo (FSE) pulse sequence.

SE Pulse Sequence

In one embodiment of the present invention, an operator initiates the MR imaging system, i.e., start loop step 600, to acquire the MR image of the object of interest using the SE pulse sequence. Depending on the capabilities of the MR imaging system, the operator may directly specify the SE pulse sequence from among a list of pulse sequences; the system may be preset to the SE pulse sequence; or based on scan time, image resolution, type of tissue to be imaged, and other requirements, the system may select the SE pulse sequence. Once the SE pulse sequence has been chosen, this pulse sequence will be configured including carrying out the prepare vibrating magnetic field b(t) step 602. Prepare step 602 includes configuring the frequencies, amplitudes, and initial phases of $b_o(t)$, $g_x(t)$, $g_y(t)$, and $g_z(t)$ comprising b(t).

Figure 4:
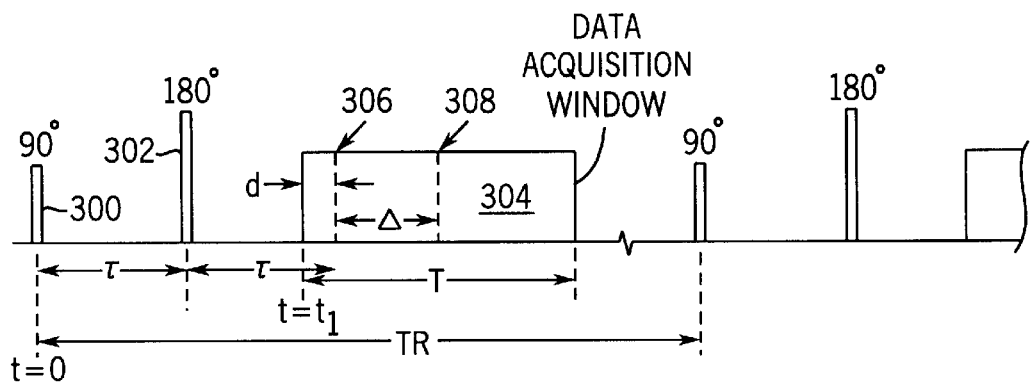
FIG. 4 is a simplified diagram of a spin echo (SE) pulse sequence used in one embodiment of the scheme of FIG. 3.

Referring to FIG. 4, there is shown a simplified waveform diagram of the SE pulse sequence. As is well-known in the art, the SE pulse sequence includes a 90° RF pulse 300, a 180° RF pulse 302, and a data acquisition window 304 (during which the readout gradient is on). A reference time point of t=0 is set at the center of the 90° RF pulse 300 of a first repetition cycle (or TR). The time from the 90° RF pulse 300 to the 180° RF pulse 302 is referred to as a half echo time τ. The data acquisition window 304 is turned on after the 180° RF pulse 302, from $t_1 \leq t \leq t_1+T$, where time $t_1 < 2\tau$ and T is a duration of the data acquisition window. The data acquisition window 304 is also referred to as an analog-to-digital converter (ADC) window.

Shown in FIG. 4, the data acquisition window 304 indicates a fractional echo center 306, located at a time $t=t_1+d$, and a full echo center 308, located as a time $t=t_1+d+\Delta$. The scheme is applicable for the SE pulse sequence including a fractional echo acquisition or a full echo acquisition. The full echo acquisition case can be considered as a special case of the fractional echo acquisition in which $\Delta=0$. From FIG. 4, a fractional echo parameter can be defined as:

$$\text{frac\_echo} = 1 - \frac{2\Delta}{T}, \quad (4a)$$

and the following timing relationship can be derived:

$$t_1 = 2\tau - \frac{T}{2}(\text{frac\_echo}), \text{ and} \quad (4b)$$

$$T = \frac{k_{xres}}{2 \cdot rbw} \quad (4c)$$

where rbw is a receiver bandwidth (i.e., the signal frequency ranges from −rbw to +rbw) and $k_{xres}$ is the total number of acquired k-space data points along the readout direction (i.e., $k_{xres}=p$). The SE pulse sequence will be configured to have a time period TR and to repeat a total of q times (with slight changes to the nominal phase-encoding gradient $G_y$ in each nth TR, where n=1, 2, . . . , q) to acquire all q rows of k-space data.

Once the SE pulse sequence has been configured, the calculate vibration component steps 604–610 will be carried out. Preferably, steps 604–610 for the nth echo or TR are completed before the corresponding pulse sequence for the nth echo or TR is applied to the object of interest to acquire the nth row of k-space data. Although steps 604–610 are shown in successive order, steps 604–610 may be performed in any order or even simultaneously as long as steps 604–610 are completed prior to the initiation of the nth pulse sequence. In this manner, the vibration error components can be compensated for before, during, or after the data acquisition.

Turning to the calculate vibration component of $b_{o,n}(t)$ step 604, the vibration error component for $b_o(t)$ produces a phase error $\phi_o(t)$. For each TR time period, the phase error $\phi_o(t)$ can be expressed by three terms: (1) the first term covering the time period from the 90° RF pulse 300 to the 180° RF pulse 302 ($0 \leq t \leq \tau$); (2) the second term covering the time period from the 180° RF pulse 302 to the beginning of the data acquisition window 306 ($\tau \leq t \leq t_1$); and (3) the third term covering the time period during the data acquisition window 306 ($t_1 \leq t' \leq t$) (see FIG. 4).

Thus, phase error $\phi_o(t)$ for the first TR (i.e., n=1) is:

$$\phi_0(t) = -2\pi\gamma \int_0^\tau b_0(t)dt + 2\pi\gamma \int_\tau^{t_1} b_0(t)dt + 2\pi\gamma \int_{t_1}^t b_0(t')dt' \quad (5)$$

where γ is a gyromagnetic constant, the first term includes a negative sign to take into account the phase reversal effect of the 180° RF pulse, and $b_o(t)$ is provided in Equation (3a). The phase error $\phi_o(t)$ represents the total phase error (or vibration error component) from the vibrating $b_o(t)$ that will occur for the first TR period during the data acquisition.

Since the SE pulse sequence will repeat after the first TR, the phase errors for all the subsequent TR periods can be calculated using Equation (5) modified by a new $b_o(t)$ appropriate for each particular TR interval. It can be seen that for any time t' within the first TR period (at t=t'), $b_o(t)$ in the first TR period is:

$$b_{0,1}(t') = \sum_{m=1}^{M_0} a_m \sin(2\pi f_m t' + \zeta_m) \quad (6a)$$

and $b_o(t)$ at any time within the second TR period (at t=t'+TR) is:

$$b_{0,2} = \sum_{m=1}^{M_0} a_m \sin[2\pi f_m(t' + TR) + \zeta_m] \quad (6b)$$

$$= \sum_{m=1}^{M_0} a_m \sin[2\pi f_m t' + 2\pi f_m TR + \zeta_m]$$

$$= \sum_{m=1}^{M_0} a_m \sin[2\pi f_m t' + \zeta_{m,1}]$$

where the time variable t in $b_o(t)$ of Equation (3a) has been substituted with t' and t'+TR in Equations (6a) and (6b), respectively. With this substitution, it is apparent that $b_o(t)$ at the second TR (i.e., $b_{o,2}(t)$) is essentially the same as $b_o(t)$ at the first TR (i.e., $b_{o,1}(t)$) except that the phase $\zeta_m$ in Equation (6a) has been changed to:

$$\zeta_{m,1} = 2\pi f_m TR + \zeta_m. \quad (6c)$$

Accordingly, $b_o(t)$ in Equation (3a) at any TR period for a given MR image acquisition can be more generally expressed as:

$$b_{0,n}(t) = \sum_{m=1}^{M_0} a_m \sin(2\pi f_m t + \zeta_{m,n-1}) \quad (7a)$$

where n=1, 2, . . . , q; q=total number of TR periods or rows of k-space data; $0 \leq t \leq TR$ for the nth TR; and $\zeta_{m,n-1} = 2\pi(n-1)f_m TR + \zeta_m$.

Then Equation (5) can be generalized to calculate a phase error $\phi_{o,n}(t)$ of $b_{o,n}(t)$ for any nth TR period within a given MR image acquisition:

$$\phi_{0,n}(t) = -2\pi\gamma \int_0^\tau b_{0,n}(t)dt + 2\pi\gamma \int_\tau^{t_1} b_{0,n}(t)dt + \quad (7b)$$

-continued $$2\pi\gamma \int_{t_1}^{t} b_{o,n}(t')dt'.$$

Hence in step 604, the phase error $\phi_{o,n}(t)$ of $b_{o,n}(t)$ for the nth row of k-space data to be acquired is calculated using Equations (7a) and (7b). Depending on the form of $b_{o,n}(t)$, $\phi_{o,n}(t)$ for the nth echo or TR can be solved either numerically or analytically.

For the calculate vibration component of $g_{x,n}(t)$ step 606, the vibration error component of $g_x(t)$ produces a $k_x$-space displacement error $\Delta k_x(t)$. The $k_x$-space displacement error $\Delta k_x(t)$ results in k-space data distortion in the $k_x$ direction.

Similar to the characterization or derivation of $b_o(t)$ to $b_{o,n}(t)$ in Equation (7a), $g_x(t)$ in Equation (3b) can be characterized with respect to the nth TR period to:

$$g_{x,n}(t) = \sum_{m=1}^{M_x} g_{x,m}\sin(2\pi f_{x,m}t + \zeta_{x,m,n-1}) \tag{8a}$$

where $\zeta_{x,m,n-1}=2\pi(n-1)f_{x,m}TR+\zeta_{x,m}$. Then $\Delta k_{x,n}(t)$ for the nth TR can be calculated using Equation (7b) with the substitution of $b_{o,n}(t)$ with $g_{x,n}(t)$ in Equation (8a):

$$\Delta k_{x,n}(t) = -2\pi\gamma \int_0^{\tau} g_{x,n}(t)dt + 2\pi\gamma \int_{\tau}^{t_1} g_{x,n}(t)dt + \tag{8b}$$

$$2\pi\gamma \int_{t_1}^{t} g_{x,n}(t')dt'.$$

Hence in step 606, the $k_x$-space displacement error $\Delta k_{x,n}(t)$ of $g_{x,n}(t)$ for the nth row of k-space data to be acquired is calculated using Equations (8a) and (8b). Depending on the form of $g_{x,n}(t)$, $\Delta k_{x,n}(t)$ can be solved either numerically or analytically.

For the calculate vibration component of $g_{y,n}(t)$ step 608, the vibration error component of $g_y(t)$ produces a $k_y$-space displacement error $\Delta k_y(t)$. The $k_y$-space displacement error causes k-space data points to be distorted in the $k_y$ direction. The phase-encoding gradient error of $g_y(t)$ is the counterpart to the readout gradient error of $g_x(t)$, and Equations (8a) and (8b) need merely be modified to yield $g_{y,n}(t)$ and $\Delta k_{y,n}(t)$:

$$g_{y,n}(t) = \sum_{m=1}^{M_y} g_{y,m}\sin(2\pi f_{y,m}t + \zeta_{y,m,n-1}) \tag{9a}$$

$$\Delta k_{y,n}(t) = -2\pi\gamma \int_0^{\tau} g_{y,n}(t)dt + 2\pi\gamma \int_{\tau}^{t_1} g_{y,n}(t)dt + \tag{9b}$$

$$2\pi\gamma \int_{t_1}^{t} g_{y,n}(t')dt'$$

where $g_{y,n}(t)$ is $g_y(t)$ in Equation (3c) expressed with respect to the nth TR period and $\zeta_{y,m,n-1}=2\pi(n-1)f_{y,m}TM+\zeta_{y,m}$. Hence in step 608, the $k_y$-space displacement error $\Delta k_{y,n}(t)$ of $g_{y,n}(t)$ for the nth row of k-space data to be acquired is calculated using Equations (9a) and (9b). The $k_y$-space displacement error $\Delta k_{y,n}(t)$ may be mathematically solved by numerical or analytical methods.

For the calculate vibration component of $g_z(t)$ step 610, the vibration error component of $g_z(t)$ produces a slice-selection gradient error $\Delta k_z$. Unlike $\phi_{o,n}(t)$, $\Delta k_{x,n}(t)$, and $\Delta k_{y,n}(t)$, $\Delta k_z$ can be approximated with a time-independent function, $\Delta k_{z,n}$ which is evaluated using a time interval from the nth 90° RF pulse to the center of the nth echo. Taking into account the phase reversal effect of the nth 180° RF pulse, $\Delta k_{z,n}$ for the nth TR is:

$$\Delta k_{z,n} = 2\pi\gamma\left[-\int_{(n-1)TR}^{(n-1)TR+\tau} g_z(t)dt + \int_{(n-1)TR+\tau}^{(n-1)TR+2\tau} g_z(t)dt\right] \tag{10}$$

where $g_z(t)$ is given by Equation (3d). Similar to Equations (7b), (8b), and (9b), Equation (10) can also be expressed as:

$$\Delta k_{z,n}(t) = -2\pi\gamma \int_0^{\tau} g_{z,n}(t)dt + 2\pi\gamma \int_{\tau}^{2\tau} g_{z,n}(t)dt, \tag{10a}$$

where $$g_{z,n}(t) = \sum_{m=1}^{M_z} g_{z,n}\sin(2\pi f_{z,m}t + \zeta_{z,m,n-1}), \tag{10b}$$

$$\zeta_{z,m,n-1}=2\pi(n-1)f_{z,m}TR+\zeta_{z,m}. \tag{10c}$$

After steps 604–610 have been carried out, the next step is the initiate image data acquisition step 612. In step 612, the SE pulse sequence configured to acquire the nth row of k-space data is applied to the object of interest.

Figure 5:
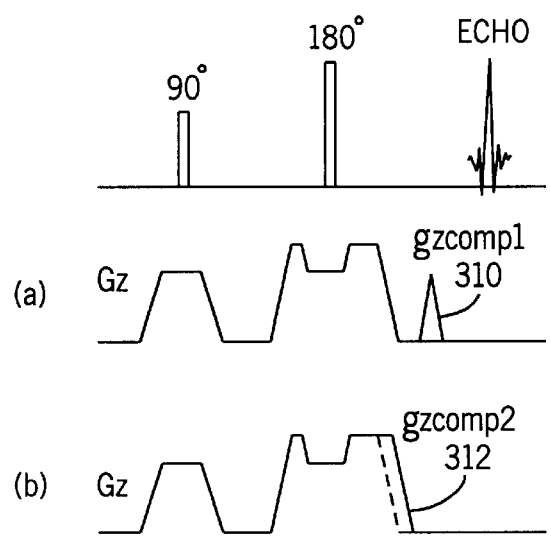
FIG. 5 is a waveform diagram including a part of the correction technique of the scheme of FIG. 3.

The compensate step 614 occurs prior to the image data acquisition of the nth row of k-space data. Preferably, the slice-selection gradient $G_z(t)$ for the nth TR is modified by including a correction pulse or waveform configured from the calculated $\Delta k_{z,n}$ for the nth TR. As shown in FIG. 5, the correction pulse or waveform can be (a) a blip gradient pulse 310 $g_{zcomp1}$ (see FIG. 5(a)) having an area under the pulse of $-\Delta k_{z,n}/2\pi\gamma$, or (b) an additional crusher or slice refocusing gradient pulse 312 $g_{comp2}$ (see FIG. 5(b)) also having an area under the pulse of $-\Delta k_{z,n}/2\pi\gamma$. In either case, the correction pulse or waveform functions to "cancel" the $\Delta k_{z,n}$ error induced by the original vibrating $g_z(t)$ for the nth TR.

Although the blip gradient pulse 310 is shown in FIG. 5(a) as occurring after the nth 180° RF pulse, it can alternatively perform the compensation from any time after the nth 90° RF pulse to before the start of the nth echo. The shape of the blip gradient pulse 310 is flexible, and not limited to the triangular shape shown. However, if a positive pulse is used in the time period between the 180° RF pulse and the start of the echo, then a negative pulse would have to be implemented when used in the time period between the 90° and 180° RF pulses (to offset the phase reversal effect of the 180° RF pulse). Similarly, the additional gradient pulse 312 can also occur at any time after the 90° RF pulse to before the start of the echo, be any pulse shape, and would have to flip the polarity when between the 90° and 180° RF pulses.

In FIG. 3, although steps 614–620 are shown in consecutive order, steps 614–620 do not necessarily follow this order and may be performed simultaneously. In the compensate step 616, the phase error $\phi_{o,n}(t)$ induced by $b_{o,n}(t)$ can be compensated for in the nth row of k-space data after the data acquisition but before image reconstruction. The compensation or correction comprises using the phase error $\phi_{o,n}(t)$ for the nth TR (calculated using Equation (7b)) to perform a phase subtraction with each k-space data point in the nth row. In this manner, image artifacts which will result from the perturbing (i.e., vibrating) $b_{o,n}(t)$ is minimized or eliminated. For a more detailed description of the phase subtraction correction method, reference is made to U.S. Pat. No.

5,642,047 owned by the General Electric Company, which is incorporated herein by reference.

Alternatively, instead of correcting k-space data that are vibration contaminated (i.e., correction after data acquisition), compensate step 616 may comprise performing the correction of $\phi_{o,n}(t)$ for the nth TR while the nth row data acquisition is in progress. The phase error $\phi_{o,n}(t)$ for the nth TR can be compensated for by dynamically adjusting the phase of the receiver portion of transceiver 150. Using this approach, although the MR echo signal emitted from the object of interest is vibration contaminated, the data acquired are free of the vibration error because the data acquisition or receiving apparatus itself is being used to offset the error and acquire the correct data. In still another alternative, phase error $\phi_{o,n}(t)$ for the nth TR may be corrected for by accordingly adjusting the main magnetic field or changing the receiver frequency for the nth TR before the acquisition of the nth k-space data. This pre-execution compensation approach is particularly effective when $b_{o,n}(t)$ is a constant value for the entire nth row of k-space. For a more detailed description of the correction methods employing adjustment of the receiver phase and frequency, references are made to U.S. Pat. Nos. 5,864,233 and 5,923,168, both owned by the General Electric Company, which are incorporated herein by reference.

In the compensate steps 618, 620, the $k_x$-space displacement error $\Delta k_{x,n}(t)$ induced by $g_{x,n}(t)$ and the $k_y$-space displacement error $\Delta k_{y,n}(t)$ induced by $g_{y,n}(t)$, respectively, will be compensated for in the nth row of acquired k-space data before image reconstruction. The displacement errors $\Delta k_{x,n}(t)$ and $\Delta k_{y,n}(t)$ for the nth TR (calculated using Equations (8b) and (9b)) are used to restore the distorted k-space to a rectilinear grid using one of known regridding algorithms. For more details relating to regridding algorithms, reference is made to "Selection of a Convolution Function for Fourier Inversion Using Gridding" by J. I. Jackson et al., IEEE Transactions in Medical Imaging, 10: 473–478 (1991), which is incorporated herein by reference.

Alternatively, the gradient errors caused by the magnet vibration, $g_{x,n}(t)$ and $g_{y,n}(t)$, for the nth TR can be compensated through pulse sequence modification. In this approach, each of the two error terms of $g_{x,n}(t)$ and $g_{y,n}(t)$, respectively, is further divided into a pre-acquisition error and an acquisition error.

The pre-acquisition errors associated with $g_{x,n}(t)$ and $g_{y,n}(t)$ are described by two k-space offsets for the nth row of k-space data, shown in Equations (11a) and (11b), respectively:

$$\Delta k_{x,n,pre} = -2\pi\gamma \int_o^\tau g_{x,n}(t)dt + 2\pi\gamma \int_\tau^{t_1} g_{x,n}(t)dt, \text{ and} \quad (11a)$$

$$\Delta k_{y,n,pre} = -2\pi\gamma \int_o^\tau g_{y,n}(t)dt + 2\pi\gamma \int_\tau^{t_1} g_{y,n}(t)dt. \quad (11b)$$

The pre-acquisition errors can be compensated using a readout and a phase-encoding gradient pulse whose area equals to $-\Delta k_{x,n,pre}/(2\pi\gamma)$ and $-\Delta k_{y,n,pre}/(2\pi\gamma)$, respectively. The compensatory gradient pulses may be independent pulses or may be combined with the existing gradient pulses, such as the dephasing readout gradient pulse and the nominal phase-encoding gradient pulses.

The acquisition errors are described as two perturbation gradients on the readout and phase-encoding gradient axes, respectively:

$$g_{x,n,acq}(t)=g_{x,n}(t) \text{ with } t_1 \leq t < t_1+T, \quad (11c)$$

$$g_{y,n,acq}(t)=g_{y,n}(t) \text{ with } t_1 \leq t < t_1+T. \quad (11d)$$

The readout gradient error $g_{x,n,acq}(t)$ can be compensated by changing the nominal readout gradient from $G_x(t)$ to $G_x(t)-g_{x,n,acq}(t)$. The phase-encoding gradient error gy,n acq(t) can be compensated by adding a cancellation gradient equal to $-g_{y,n,acq}(t)$ to the phase-encoding gradient axis concurrent with the readout gradient. Unlike the previous k-space correction method using regridding, the compensation approach based on pulse sequence modification produces k-space data free from the vibration effects. Therefore, the acquired k-space data can be directly used for image reconstruction.

In decision step 624, if all the rows of k-space data for a given MR image have not been corrected (i.e., n<q), then decision step 624 directs the calculations and corrections relating to the next vibration error components (i.e., n=n+1 in step 628) to be performed. Otherwise, if all the rows of k-space data for a given MR image have been corrected (i.e., n=q), then decision step 624 directs the magnetic field vibration quantification and compensation process to end for this MR image. Next, image reconstruction is carried out in step 622. Image reconstruction is possible using any one of well-known reconstruction techniques such as a Fourier transform with Fermi filters or a Homodyne reconstruction algorithm for fractional echo or fractional number of excitations (NEX) data sets. The reconstructed image data set, which should now include minimal or no image artifacts caused by magnet vibration, is suitable for image display, storage, transmission to a remote site, film or print record, or other utilization and manipulations, for use in, for example, medical diagnosis or further processing.

FGRE Pulse Sequence

In another embodiment of the present invention, the magnetic field vibration quantification and compensation scheme is applied to an MR image acquired using the FGRE pulse sequence. Much of the above description of the scheme with respect to the SE pulse sequence is also applicable with respect to the FGRE pulse sequence. Equations, time intervals of interest, and/or other parameters unique to the implementation of the FGRE pulse sequence will be discussed below.

Once the FGRE pulse sequence has been chosen, the start loop step 600 is entered to initiate the quantification and compensation scheme. Next, the prepare b(t) step 602 is carried out as part of the configuration of the FGRE pulse sequence. Prepare step 602 includes configuring or specifying the frequencies, amplitudes, and initial phases of $b_o(t)$, $g_x(t)$, $g_y(t)$, and $g_z(t)$ comprising b(t).

Figure 6:
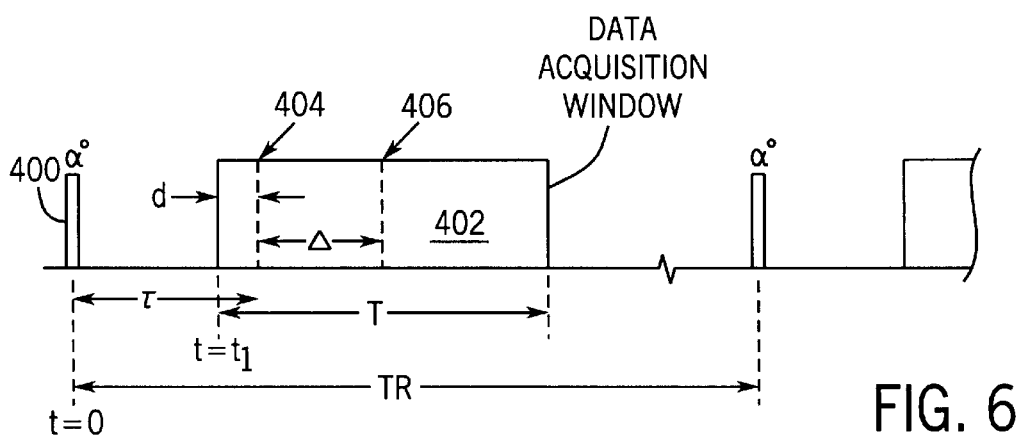
FIG. 6 is a simplified diagram of a fast gradient echo (FGRE) pulse sequence used in another embodiment of the scheme of FIG. 3.

Referring to FIG. 6, there is shown a simplified diagram of the FGRE pulse sequence. As is well-known in the art, the FGRE pulse sequence includes an ($\alpha°$ RF pulse 400 and a data acquisition window 402 (during which the readout gradient $G_x(t)$ is active). The $\alpha°$ RF pulse 400 is an RF pulse with $\alpha$ typically ranging from 5 to 90 degrees, and preferably between 30 to 60 degrees. A reference time point of t=0 is set at the center of the $\alpha°$ RF pulse 400 of the first TR. The data acquisition window 402, also referred to as an analog-to-digital converter (ADC) window, is turned on at time $t=t_1$ after the $\alpha°$ RF pulse 400 and remains on for a T time period. A fractional echo center 404, located at a time $t=t_1+d$, and a full echo center 406, located at a time $t=t_1+d+\Delta$, are also shown with respect to window 402, where $\Delta$ is the separation between the peak of the MR echo signal and the center of the window 402. The FGRE pulse sequence is intended to cover both a fractional echo acquisition case and a full echo acquisition case. The full echo acquisition can be considered as a special case of the fractional echo acquisition in which $\Delta=0$. The timing relationships provided in Equations (4a)–

(4c) are applicable for the FGRE pulse sequence shown in FIG. 6. The FGRE pulse sequence is configured to have a repetition time or period TR and to repeat a total of q times (with different phase-encoding gradient $G_y(t)$ for each nth TR, where n=1, 2, . . . , q) to acquire a total of q rows of k-space data for a desired MR image.

After the prepare b(t) step 602, the calculate vibration component steps 604–610 are carried out. In the calculate vibration component of $b_{o,n}(t)$ step 604, phase error $\phi_{o,n}(t)$ for the nth TR is calculated by two terms: (1) the first term covering the time period from the nth α° RF pulse to the beginning of the nth data acquisition window ($0 \leq t \leq t_1$), and (2) the second term covering the time period during the nth row data acquisition ($t_1 \leq t' \leq t$) (see FIG. 6). Thus, phase error $\phi_{o,n}(t)$ for the nth TR using the FGRE pulse sequence is given by modifying Equation (7b) to:

$$\phi_{0,n}(t) = 2\pi\gamma \int_0^{t_1} b_{0,n}(t)dt + 2\pi\gamma \int_{t_1}^{t} b_{0,n}(t')dt' \tag{12}$$

where γ is the gyromagnetic constant and $b_{o,n}(t)$ is given in Equation (7a). Notice there is no need to take into account the phase reversal effect because no refocusing RF pulses are used in the FGRE pulse sequence.

In the calculate vibration component of $g_{x,n}(t)$ step 606, $k_x$-space displacement error $\Delta k_{x,n}(t)$ for the nth TR using the FGRE pulse sequence is calculated using Equation (12) except substituting $b_{o,n}(t)$ with $g_{x,n}(t)$ in Equation (8a) to:

$$\Delta k_{x,n}(t) = 2\pi\gamma \int_0^{t_1} g_{x,n}(t)dt + 2\pi\gamma \int_{t_1}^{t} g_{x,n}(t')dt'. \tag{13}$$

In the calculate vibration component of $g_{y,n}(t)$ step 608, $k_y$-space displacement error $\Delta k_{y,n}(t)$ for the nth TR using the FGRE pulse sequence is calculated using Equation (12) except substituting $b_{o,n}(t)$ with $g_{y,n}(t)$ in Equation (9a) to:

$$\Delta k_{y,n}(t) = 2\pi\gamma \int_0^{t_1} g_{y,n}(t)dt + 2\pi\gamma \int_{t_1}^{t} g_{y,n}(t')dt'. \tag{14}$$

In the calculate vibration component of $g_z(t)$ step 610, slice-selection gradient error $\Delta k_{z,n}$ for the nth TR using the FGRE pulse sequence is given by modifying Equation (10) to cover the time interval from the nth α° RF pulse to the center of the nth MR echo signal:

$$\Delta k_{z,n} = 2\pi\gamma \int_{(n-1)TR}^{(n-1)TR+\tau} g_z(t)dt. \tag{15}$$

Alternatively, Equation (15) may also be expressed as:

$$\Delta k_{z,n} = 2\pi\gamma \int_0^{\tau} g_{z,n}(t)dt, \tag{15a}$$

where $g_{z,n}(t)$ is given by Equation (10b).

Using Equations (12)–(15a) to numerically or analytically calculate the vibration error components, the appropriate compensate steps 614–620 can be carried out to correct the nth row of k-space data as discussed above. For example, in the compensate step 614, the correction pulse or waveform would have an area under the pulse of $-\Delta_{k,n}/2\pi\gamma$. Moreover, the correction pulse or waveform may be the blip gradient pulse or the additional crusher or slice refocusing gradient pulse as shown in FIGS. 5(a)–5(b), respectively. The correction pulse could be added anywhere from after the nth α° RF pulse to before the start of the nth echo. But since no refocusing RF pulses are utilized, there is no need to negate the polarity of the correction pulse to offset the phase reversal effect.

The process would be repeated for the next TR period until all q rows of k-space data have been corrected of the undesirable presence of magnet vibration. With the corrected k-space data, an MR image is then reconstructed in reconstruction step 622.

FSE Pulse Function

In still another embodiment of the present invention, the magnetic field vibration quantification and compensation scheme is shown applied to an MR image acquired using the FSE pulse sequence. Again, the earlier description provided with respect to the SE pulse sequence is applicable to this pulse sequence, with variations in equations and other parameters discussed below.

Figure 7:
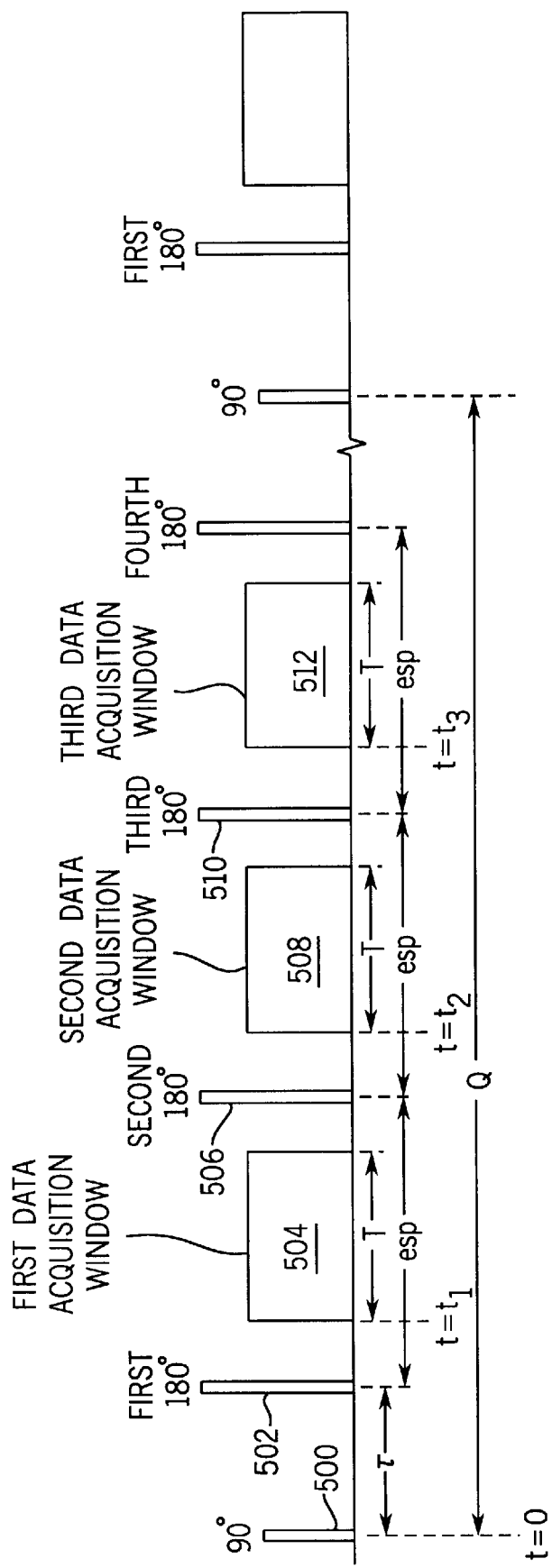
FIG. 7 is a simplified diagram of a fast spin echo (FSE) pulse sequence used in still another embodiment of the scheme of FIG. 3.

Referring to FIG. 7, there is shown a simplified diagram of the FSE pulse sequence. The FSE pulse sequence includes a 90° RF pulse 500, a first 180° RF pulse 502, a first data acquisition window 504, a second 180° RF pulse 506, a second data acquisition window 508, a third 180° RF pulse 510, and a third data acquisition window 512. A reference time point of t=0 is set at the center of the 90° RF pulse 500 of a first TR (or shot) of the data acquisition. The first 180° RF pulse 502 follows the 90° RF pulse 500 after a time interval τ. The first data acquisition window 504 follows the first 180° RF pulse 502 and is turned on at a time $t=t_1$. After the first data acquisition window 504 is turned off and at an echo spacing (esp) from the first 180° RF pulse 502, the second 180° RF pulse 506 is executed. Similarly, the third 180° RF pulse 510 is executed after a time interval esp from the second 180° RF pulse 506; and following the second and third 180° RF pulses 506, 510, the second and third data acquisition windows 508, 512 are executed at times $t=t_2$ and $t=t_3$, respectively. Each of the windows 504, 508, 512 is turned on for a time period T.

In this manner, as is well-known in the art, each FSE pulse sequence will comprise one 90° RF pulse followed by a total of j 180° RF pulses, each 180° RF pulse followed by a corresponding data acquisition window. At each data acquisition window, an echo or a row of raw k-space data is obtained. A total of i such FSE pulse sequences (also referred to as i shots) will be executed to achieve a total of q rows of raw k-space data. In other words, for an MR image to be acquired, the FSE pulse sequence needs to be executed i times or shots, each ath shot inducing j echoes and accordingly j rows of k-space data acquisition. The number of echoes per shot, j, can range from 2 to 128, and preferably j is in the range between 8 to 16. Thus, a total of q=i*j rows of data can be acquired.

Because FSE pulse sequences are more complicated than SE or FGRE pulse sequences, its vibration error components are also more complex.

Among other things, the multiple phase reversal effects caused by the 180° RF pulses (i.e., refocusing pulse trains) and stimulated echoes caused by non-ideal refocusing pulse trains need to be taken into account. To simplify calculations, it will be assumed that stimulated echo pathways can be dephased using non-constant crusher gradient waveforms, as shown in "High-field MR Microscopy Using Fast Spin Echoes," by X. Zhou et at., Magnetic Resonance in Medicine, 30:60-67 (1993), and are therefore negligible. In actuality, stimulated echo pathways are not as easily ignored in FSE pulse sequences; however, such assumptions permit reasonable approximations when the primary echoes dominate the signals. Under this condition, image artifacts can at least be reduced if not eliminated.

For the calculate step 604, $b_o(t)$ can be more conveniently expressed with respect to the ath shot based on similar derivation of Equations (6a)–(7a):

$$b_{0,a}(t) = \sum_{m=1}^{M_0} a_m \sin(2\pi f_m t + \zeta_{m,a}) \quad (16a)$$

where $\zeta_{m,a} = 2\pi(a-1)f_m Q + \zeta_{m,1}$, Q is the TR time of the FSE pulse sequence, and $a=1, 2, \ldots, i$ shots. Now consider $b_{0,a}(t)$ relating to the first echo ($c=1$, where $c=1, 2, \ldots, j$ echoes) of the ath shot. Analogous to the vibration error component of $b_{0,n}(t)$ for the SE pulse sequence, the vibration component $\phi_{1,a}(t)$ of $b_{0,a}(t)$ for the first echo of the ath shot is:

$$\phi_{1,a}(t) = -\delta_{1,a} + \Delta\phi_{1,a} + 2\pi\gamma \int_{t_1}^{t} b_{0,a}(t')dt' \quad (16b)$$

where $$\delta_{1,a} = 2\pi\gamma \int_{0}^{\tau} b_{0,a}(t)dt, \; \Delta\phi_{1,a} = 2\pi\gamma \int_{\tau}^{t_1} b_{0,a}(t)dt,$$

and $t_1 = \text{esp} - T/2$. For the second echo ($c=2$) of the ath shot, the vibration component $\phi_{2,a}(t)$ of $b_{0,a}(t)$ is:

$$\phi_{2,a}(t) = -\delta_{2,a} + \Delta\phi_{2,a} + 2\pi\gamma \int_{t_2}^{t} b_{0,a}(t')dt' \quad (17)$$

where $$\delta_{2,a} = -\delta_{1,a} + 2\pi\gamma \int_{\tau}^{3\tau} b_{0,a}(t)dt,$$

$$\Delta\phi_{2,a} = 2\pi\gamma \int_{\tau}^{t_2} b_{0,a}(t)dt,$$

and $t_2 = 2\text{esp} - T/2$.

Thus, a general expression of the vibration component $\phi c, a(t)$ of $b_{0,a}(t)$ for any cth echo in the ath shot is given by:

$$\phi_{c,a}(t) = -\delta_{c,a} + \Delta\phi_{c,a} + 2\pi\gamma \int_{t_c}^{t} b_{0,a}(t')dt' \quad (18)$$

where $$\delta_{c,a} = \sum_{h=1}^{c} \theta_{h,a}(-1)^{h+\mathrm{mod}(h,2)}$$

(the accumulated phase up to the cth 180° RF pulse in the ath shot), $$\theta_{1,a} = 2\pi\gamma \int_{0}^{\tau} b_{0,a}(t)dt \quad \text{(the phase at the } c = 1 \; 180° \; RF \text{ pulse) and}$$

$$\theta_{h,a} = 2\pi\gamma \int_{(h-1)\tau}^{(h+1)\tau} b_{0,a}(t)dt, \quad \text{(for } h \geq 2\text{)}$$

(the phase from (h-1)th to the hth 180° RF pulses), $$\Delta\phi_{c,a} = 2\pi\gamma \int_{(2c-1)\tau}^{t_c} b_{0,a}(t)dt$$

(the phase from the cth 180° RF pulse to the beginning of the cth data acquisition window), $$t_c = 2c \cdot \tau = T/2$$

(the starting data acquisition time of the cth echo in the ath shot), and mod(h,2) denotes the remainder of h/2. Hence, each cth echo in the ath shot (or in other words, each nth row of k-space data acquired, where $n=c+j(a-1)$) will have vibration error $\phi_{c,a}(t)$ associated with it. Each vibration error $\phi_{c,a}(t)$ will be associated with its corresponding nth k-space row according to the FSE view ordering tables. The FSE view ordering table relates each echo to a nth k-space row such that the plurality of echoes emitted in all the shots can be properly identified and indexed.

In the calculate step 606, $k_x$-space displacement error $\Delta k_{x,c,a}(t)$ of $g_{x,a}(t)$ for the cth echo in the ath shot (in other words the nth row of k-space data) using the FSE pulse sequence is calculated using an equation similar to Equation (18) but substituting $b_{0,a}(t)$ with $g_{x,a}(t)$. Similarly, in the calculate step 608, $k_y$-space displacement error $\Delta k_{y,c,a}(t)$ of $g_{y,a}(t)$ for the cth echo in the ath shot (in other words the nth row of k-space data) is calculated using an equation similar to Equation (18) but substituting $b_{0,a}(t)$ with $g_{y,a}(t)$.

In the calculate step 610, slice-selection gradient error $\Delta k_{z,c,a}$ of $g_z(t)$ for the cth echo in the ath shot (the nth row of k-space data) is calculated from the ath 90° RF pulse to the center of the cth echo. Slice-selection gradient error $\Delta k_{z,c,a}$ can be calculated using Equation (19):

$$\Delta k_{z,c,a} = -\delta_{z,c,a} + 2\pi\gamma \int_{(2c-1)\tau}^{2c\tau} g_{z,a}(t)dt, \quad (19)$$

where $$\delta_{z,c,a} = \sum_{h=1}^{c} \theta_{z,h,a}(-1)^{h+\mathrm{mod}(h,2)},$$

$$\theta_{z,1,a} = 2\pi\gamma \int_{0}^{\tau} g_{z,a}(t)dt,$$

$$\theta_{z,h,a} = 2\pi\gamma \int_{(h-1)\tau}^{(h+1)\tau} g_{z,a}(t)dt \quad (h \geq 2).$$

As with the phase error $\phi_{c,a}(t)$ each of the gradient induced errors is also correlated to its corresponding nth k-space row according to the FSE view ordering tables.

Once all vibration error components, or k-space phase errors, are known, acquisition of the nth row of k-space data, or more preferably of all j echoes in the ath shot, is initiated in step 612. Next, compensate steps 614–620 are carried out to correct the phase errors in the cth echo of the ath shot. For example, in compensate step 614, the correction pulse or waveform would have an area under the pulse of $-\Delta k_{z,c,a}/2\pi\gamma$.

Figure 8:
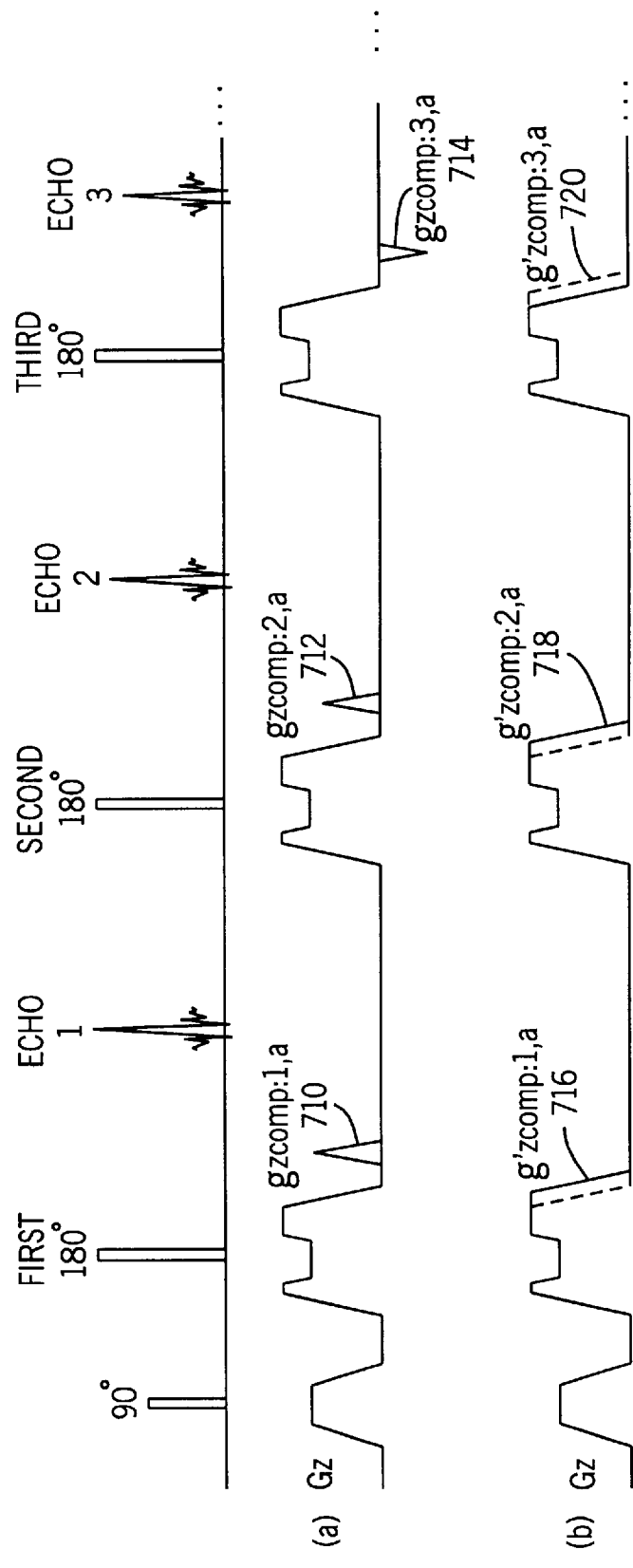
FIG. 8 is a waveform diagram including a part of the correction technique of the scheme of FIG. 3.

As shown in FIG. 8, the correction pulse, which is added to or combined with the slice-selection gradient, can be (a)

a blip gradient pulse $g_{zcomp,c,a}$ having an area under the pulse of $-\Delta k_{z,c,a}/(2\pi\gamma)$, or (b) an additional crusher or slice refocusing gradient pulse $g'_{zcomp,c,a}$ also having an area under the pulse of $-\Delta k_{z,c,a}/(2\pi\gamma)$. Preferably, j blip gradient pulses, such as blip gradient pulses 710,712,714, etc. having areas under the pulses of $-\Delta k_{z,1,a}/(2\pi\gamma)$, $-\gamma k_{z,2,a}/(2\pi\gamma)$, $-\gamma k_{z,3,a}/(2\pi\gamma)$, etc., respectively, are applied to the slide-selection gradient (see FIG. 8(*a*)). The blip gradient pulses can be positive or negative pulses. Alternatively, the j compensation gradient pulses can be combined with the existing crusher or slice refocusing gradient pulses 716,718,720, etc. having additional areas of $-\Delta k_{z,1,a}/(2\pi\gamma)$, $-\Delta k_{z,2,a}/(2\pi\gamma)$, $-\Delta k_{z,3,a}/(2\pi\gamma)$, etc., respectively (see FIG. 8(*b*)). Each additional gradient is applied such that it occurs after its corresponding refocusing RF pulse. Compensation for the other errors, $\phi_{c,a}(t)$, $\Delta k_{x,c,a}(t)$ and $\Delta k_{y,c,a}(t)$, can be carried out by receiver phase adjustment and k-space regridding as discussed for the SE pulse sequence.

The process shown in FIG. 3 will repeat i times to calculate and compensate for each echo in each shot. After the compensate steps 614–620 have been completed, image reconstruction step 222 occurs using well-known reconstruction techniques. In this manner, image artifacts caused by undesirable magnet or magnetic field vibrations can be eliminated or reduced in the MR image acquired using the FSE pulse sequence.

While the embodiments of the invention illustrated in the FIGS. and described above are presently preferred, it should be understood that these embodiments are offered by way of example only. For example, it is contemplated that more or less than four vibration components (one $b_0$ field and three linear gradient fields) may be calculated and corrected for in a given row of k-space data. In another example, image artifacts caused by magnet vibration may also be corrected in three dimensional MR images. For three dimensional images, the calculate vibration component of $g_z(t)$ step 610 and the compensate step 614 may be replaced with steps similar to the calculate and compensate vibration component of $g_y(t)$ steps 608, 620. In still another example, each of the vibration error components for all q rows of k-space data may be stored in a memory device such that the compensate steps 616–620 need not be carried out for each nth row of k-space data as it is being acquired. Instead, the compensation may take place after all the rows of k-space data have been acquired. It is also contemplated that MR images acquired using other types of pulse sequences, such as an echo planar imaging (EPI) pulse sequence, may benefit from the present invention. Accordingly, the present invention is not limited to a particular embodiment, but extends to various modifications that nevertheless fall within the scope of the appended claims.

What is claimed is:

1. A method for quantifying an error associated with acquisition of a magnetic resonance (MR) image, the error produced by vibration of at least one magnet included in an MR imaging system, comprising:
identifying a perturbation magnetic field representative of the vibration of the at least one magnet, the perturbation magnetic field being present during acquisition of the MR image; and
calculating the error as a function of the perturbation magnetic field, wherein the error is at least one of a phase error, a k-space displacement error, or a slice selection gradient error.

2. The method of claim 1, wherein the perturbation magnetic field includes at least a spatially invariant magnetic field, a spatially linear readout magnetic field gradient, a spatially linear phase-encoding magnetic field gradient, and a spatially linear slice-selection magnetic field gradient.

3. The method of claim 2, wherein calculating the error includes calculating the phase error as a function of the spatially invariant magnetic field.

4. The method of claim 2, wherein calculating the error is repeated for each row of a k-space data set representative of the MR image.

5. The method of claim 2, wherein the k-space displacement error includes a $k_x$-space displacement error and a $k_y$-space displacement error.

6. The method of claim 5, wherein calculating the error includes calculating the $k_x$-space displacement error as a function of the spatially linear readout magnetic field gradient.

7. The method of claim 5, wherein calculating the error includes calculating the $k_y$-space displacement error as a function of the spatially linear phase-encoding magnetic field gradient.

8. The method of claim 2, wherein calculating the error includes calculating the slice selection gradient error as a function of the spatially linear slice-selection magnetic field gradient.

9. The method of claim 8, wherein the slice selection gradient error is calculated before acquisition of the MR image.

10. The method of claim 1, wherein calculating the error includes calculating the error as a function of the perturbation magnetic field and time intervals associated with a pulse sequence used to acquire the MR image, the pulse sequence selected from a group including a spin-echo (SE) pulse sequence, a fast gradient echo (FGRE) pulse sequence, and a fast spin echo (FSE) pulse sequence.

11. An imaging system, comprising:
a magnet configured to generate a magnetic field to acquire a data set representative of an image of a subject of interest positioned in the imaging system; and
a system control in communication with the magnet and configured to calculate an error included in the data set, wherein the error is associated with vibration of the magnet during acquisition of the data set and the error is a function of a perturbation magnetic field representative of the vibration of the magnet.

12. The system of claim 11, wherein the perturbation magnetic field includes at least a spatially invariant magnetic field, a spatially linear readout magnetic field gradient, a spatially linear phase-encoding magnetic field gradient, and a spatially linear slice-selection magnetic field gradient.

13. The system of claim 12, wherein the error includes a phase error and the system control is configured to calculate the phase error as a function of the spatially invariant magnetic field.

14. The system of claim 12, wherein the error includes a slice selection gradient error and the system control is configured to calculate the slice selection gradient error as a function of the spatially linear slice-selection magnetic field gradient.

15. The system of claim 12, wherein the error includes a $k_x$-space displacement error and the system control is configured to calculate the $k_x$-space displacement error as a function of the spatially linear readout magnetic field gradient.

16. The system of claim 12, wherein the error includes a $k_y$-space displacement error and the system control is configured to calculate the $k_y$-space displacement error as a function of the spatially linear phase-encoding magnetic field gradient.

17. The system of claim 11, wherein the error includes a slice selection gradient error and the system control is configured to calculate the slice selection gradient error before acquisition of the data set.

18. The system of claim 11, wherein the system control is configured to calculate the error a plurality of times, once for each row of the data set.

19. The system of claim 11, wherein the system control is configured to calculate the error as a function of the perturbation magnetic field and time intervals associated with the magnetic field.

20. The system of claim 19, wherein the magnetic field comprises part of a spin-echo (SE) pulse sequence, a fast gradient echo (FGRE) pulse sequence, or a fast spin echo (FSE) pulse sequence.

21. A system for quantifying an error associated with acquisition of a magnetic resonance (MR) image, the error caused by magnet vibration present in an MR imaging system, comprising:

means for identifying a perturbing magnetic field representative of the magnet vibration, the perturbing magnetic field being present during acquisition of the MR image; and means for calculating the error as a function of the perturbing magnetic field, wherein the error is at least one of a phase error, a k-space displacement error, or a slice selection gradient error.

22. The system of claim 21, wherein the perturbing magnetic field includes at least a spatially invariant magnetic field, a spatially linear readout magnetic field gradient, a spatially linear phase-encoding magnetic field gradient, and a spatially linear slice-selection magnetic field gradient.

23. The system of claim 22, wherein the means for calculating is configured to calculate the phase error as a function of the spatially invariant magnetic field.

24. The system of claim 22, wherein the means for calculating is configured to calculate the error for each row of a k-space data set representative of the MR image.

25. The system of claim 22, wherein the k-space displacement error includes a $k_x$-space displacement error and a $k_y$-space displacement error.

26. The system of claim 25, wherein the means for calculating is configured to calculate the $k_x$-space displacement error as a function of the spatially linear readout magnetic field gradient.

27. The system of claim 25, wherein the means for calculating is configured to calculate the $k_y$-space displacement error as a function of the spatially linear phase-encoding magnetic field gradient.

28. The system of claim 22, wherein the means for calculating is configured to calculate the slice selection gradient error as a function of the spatially linear slice-selection magnetic field gradient.

29. The system of claim 28, wherein the means for calculating is configured to calculate the slice selection gradient error before acquisition of the MR image.

30. The system of claim 21, wherein the means for calculating is configured to calculate the error as a function of the perturbing magnetic field and time intervals associated with a pulse sequence used to acquire the MR image, the pulse sequence selected from a group including a spin-echo (SE) pulse sequence, a fast gradient echo (FGRE) pulse sequence, and a fast spin echo (FSE) pulse sequence.

* * * * *